United States Patent [19]
Moon et al.

[11] Patent Number: 5,955,929
[45] Date of Patent: Sep. 21, 1999

[54] VOLTAGE-CONTROLLED OSCILLATOR RESISTANT TO SUPPLY VOLTAGE NOISE

[75] Inventors: Yongsam Moon, Nam-gu Incheon, Rep. of Korea; Deog-Kyoon Jeong, Palo Alto, Calif.

[73] Assignee: Silicon Image, Inc., Cupertino, Calif.

[21] Appl. No.: 08/920,336

[22] Filed: Aug. 27, 1997

Related U.S. Application Data

[60] Provisional application No. 60/026,106, Aug. 27, 1996.

[51] Int. Cl.$^6$ .............................. H03B 5/04; H03B 5/24
[52] U.S. Cl. .................. 331/57; 331/175; 331/177 R; 331/177 V; 327/280; 327/281
[58] Field of Search .................................... 331/34, 36 C, 331/57, 175, 177 R, 177 V, 185, 186, 176; 327/280, 281

[56] References Cited

U.S. PATENT DOCUMENTS 5,469,120 11/1995 Nguyen et al. ...................... 331/177 R
5,705,947 1/1998 Jeong ....................................... 327/270

OTHER PUBLICATIONS

A Variable Delay Line PLL for CPU–Coprocessor Synchronization, Mark G. Johnson and Edwin L. Hudson, IEEE Journal of Solid–State Circuits, vol. SC–23, pp. 1218–1223, Oct. 1988.

A PLL Clock Generator with 5 to 110 MHz of Lock Range for Microprocessors, Ian A. Young, Jeffrey K. Greason and Keng L. Wong, IEEE Journal of Solid–State Circuits, vol. SC–27, pp. 1599–1607, Nov. 1992.

*Primary Examiner*—David Mis
*Attorney, Agent, or Firm*—Fenwick & West, LLP

[57] ABSTRACT

A voltage-controlled oscillator (VCO) generates an oscillating signal that is substantially resistant to noise fluctuations in the supply voltage. The VCO is a delay-based VCO which preferably includes a compensation circuit for each delay cell and a noise-immune reference current generator for providing a noise-immune bias current to the conditioning circuit of the VCO. The compensation circuit preferably adjusts the capacitance of the delay cell to compensate for the variations in current caused by the supply noise. The noise-immune reference current generator preferably utilizes a configuration of transistors which maintains through at least one transistor a substantially constant current which is used to bias the conditioning circuit.

24 Claims, 6 Drawing Sheets

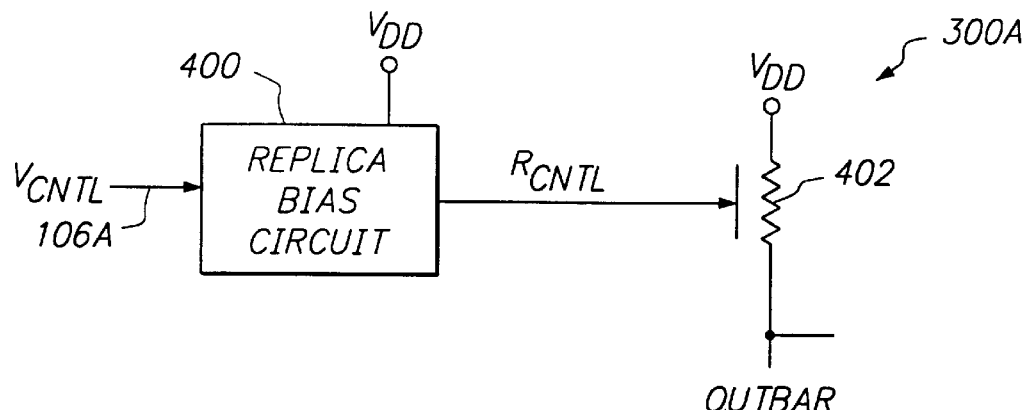
FIG. 4
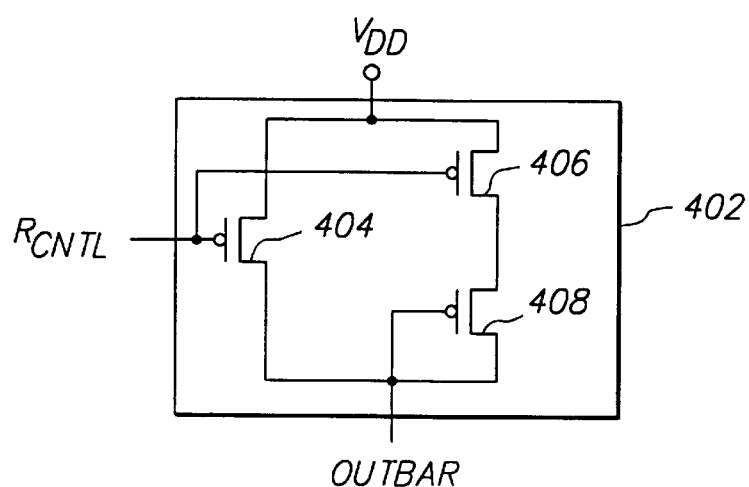
FIG. 4A
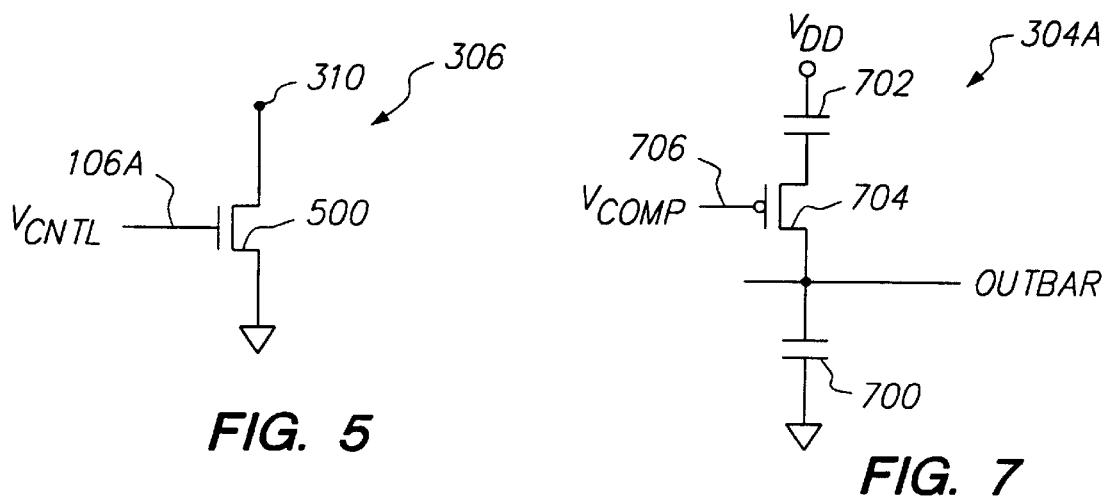
FIG. 5          FIG. 7

5,955,929

VOLTAGE-CONTROLLED OSCILLATOR RESISTANT TO SUPPLY VOLTAGE NOISE

This application claims the benefit of U.S. Provisional patent application Ser. No. 60/026,106, 'Supply Noise Independent Voltage Controlled Oscillator', by Yongsam Moon, filed Aug. 27, 1996, which subject matter is incorporated herein by reference.

BACKGROUND OF THE INVENTION

1. Field of the Invention

This invention relates generally to voltage-controlled oscillators (VCOs), and more particularly, to delay-based VCOs which are resistant to noise fluctuations in the supply voltages and may be used in phase-locked loop (PLL) clock generator.

2. Description of the Related Art

Voltage-controlled oscillators (VCOs) generate an oscillating signal, in which the frequency is determined by a control voltage received by the VCO. VCOs are one of the major components in phase-locked loops (PLLs), among other basic circuits. PLLs, in turn, are a staple building block for many other circuits, including synchronization circuits, circuits for generating local oscillators, and circuits for modulating and/or demodulating signals. As the requirements on these circuits become more stringent, the corresponding requirements on VCOs also become more demanding. For example, a high performance PLL may require very low clock jitter at its operating frequency.

A common VCO design, which we shall refer to as delay-based VCOs, generates the clock by repeatedly waiting for a half-period delay (180°) and then toggling the clock output (going from 0 to 1 or 1 to 0). Delay-based VCOs typically comprise a delay-line oscillator (including multiple delay cells) and a conditioning circuit. Delay-based VCOs are commonly used in part because circuit loops (such as PLLs) that include such a VCO are typically easy to stabilize.

Noise fluctuations in the supply voltage (supply noise), however, can introduce fluctuations in the oscillating signal produced by a conventional delay-based VCO. In particular, such supply noise typically causes fluctuations in the current from a current source in each conventional delay cell and hence in the delay time of each conventional delay cell. This results in frequency fluctuations in the oscillating signal.

Furthermore, such supply noise typically causes variations in the bias current provided by a conventional reference current generator for the conditioning circuit. This results in phase variations in the oscillating signal.

Conventional delay-based VCOs do not generally meet the stringent requirements of recent high-performance systems that operate at very high frequencies. This is in part because of their lack of sufficient immunity from supply noise. Thus, there is a need for a delay-based VCO which generates an oscillating signal that is substantially unaffected (in terms of frequency, phase, and/or amplitude) by supply noise.

SUMMARY OF THE INVENTION

In accordance with the present invention, a voltage-controlled oscillator (VCO) generates an oscillating signal that is substantially resistant to noise fluctuations in the supply voltage. In further accordance with this invention, the VCO is a delay-based VCO which preferably includes a compensation circuit for each delay cell and a noise-immune reference current generator for providing a noise-immune bias current to the conditioning circuit of the VCO. The compensation circuit preferably adjusts the capacitance of the delay cell to compensate for the variations in current caused by the supply noise. The noise-immune reference current generator preferably utilizes a configuration of transistors which maintains through at least one transistor a substantially constant current which is used to bias the conditioning circuit.

BRIEF DESCRIPTION OF THE DRAWING

The invention has other advantages and features which will be more readily apparent from the following detailed description of the invention and the appended claims, when taken in conjunction with the accompanying drawing, in which:

FIG. 4 is a block diagram of a preferred embodiment of the resistor 300A of FIG. 3;

FIG. 4A is a circuit diagram of a preferred embodiment of the voltage-controlled resistor 402 of FIG. 4;

FIG. 5 is a circuit diagram of a preferred embodiment of the voltage-controlled current source 306 of FIG. 3;

FIG. 7 is a circuit diagram of one embodiment of the variable capacitor 304B of FIG. 3;

DETAILED DESCRIPTION OF THE PREFERRED EMBODIMENTS

Figure 1:
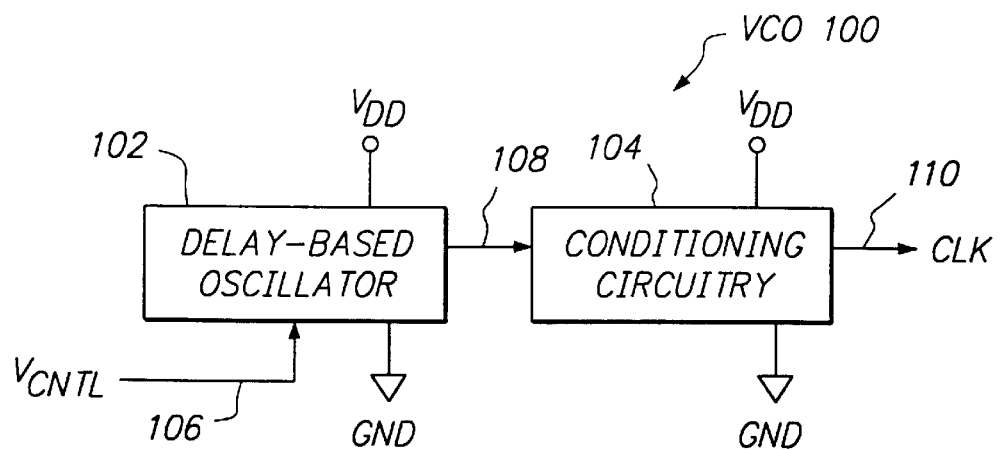
FIG. 1 is a block diagram of a voltage-controlled oscillator 100 in accordance with the present invention.

FIG. 1 is a block diagram of a voltage-controlled oscillator (VCO) 100 in accordance with the present invention. The VCO 100 includes a delay-based oscillator 102 and a conditioning circuit 104. The delay-based oscillator 102 is adapted to receive a control voltage (Vcntl) on line 106 and is coupled to send a first oscillating signal (hereinafter a first clock) on line 108 to the conditioning circuit 104. The conditioning circuit 104 is adapted to transmit a second oscillating signal (hereinafter a second clock) on line 110. Both the delay-based oscillator 102 and conditioning circuit 104 are also adapted to be coupled to a supply voltage (Vdd) a ground voltage.

The delay-based oscillator 102 generates the first clock on line 108 as follows. In a preferred embodiment, the first clock is a digital signal, toggling between two states (commonly, 0 and 1). After the first clock has toggled from one state to the other, the delay-based oscillator 102 waits for a period of time which we term the "half-period delay" and then toggles the first clock again. In other words, the delay-based oscillator 102 repeatedly waits for a half-period delay and then toggles the first clock. This produces a clock with a 50% duty cycle and a period equal to twice the half-period delay (hence, the name "half-period delay"). The control voltage Vcntl determines the length of the half-period delay, thus determining the frequency of the first clock on line 108. In a preferred embodiment, the voltage swing $\Delta V$ between the two states (0 and 1) of the first clock is between "small swing" voltage levels.

The conditioning circuitry 104 receives the first clock on line 108 and conditions the incoming clock to produce the second clock on line 110. In a preferred embodiment, the first clock on line 108 utilizes small swing differential voltage levels, the second clock on line 110 utilizes full swing CMOS voltage levels, and the conditioning circuitry 104 converts the voltage levels from small swing to full swing. One advantage to generating the first clock having small swing levels and then converting to a second clock having CMOS levels, rather than generating a single clock directly in CMOS levels, is that a delay cell which uses small swing levels may typically be made more immune to supply noise than a delay cell which uses CMOS levels. In addition, such a delay cell which uses small swing levels typically has a shorter perod and thus may be utilized to make a higher frequency clock.

More generally, the conditioning circuit 104 is not restricted to converting between small swing and CMOS voltage levels. It may convert between any two voltage levels. The conditioning circuit 104, furthermore, may perform other functions. For example, it may condition the clock received on line 108 by frequency filtering the clock, modifying the waveform of the clock, or changing the duty cycle of the clock. As further examples, the conditioning circuit 104 could also frequency divide or phase shift the clock received on line 108. Other functions will be apparent to those of ordinary skill in the art In conventional VCOs 100, noise fluctuations in the supply voltage typically cause unwanted fluctuations in the first and second clocks on lines 108 and 11 via a number of mechanisms. First, supply voltage noise typically causes fluctuations in the length of the half-period delay which, in turn, results in fluctuations in the frequency of the first and second clocks on lines 108 and 110. Second, supply voltage noise typically also causes fluctuations in the propagation delay through the conditioning circuit 104 which, in turn, results in phase fluctuations in the second clock on line 110. Third, supply voltage noise may also cause fluctuations in the voltage levels used to represent the clock states, thus resulting in amplitude fluctuations in the first and second clocks on lines 108 and 110.

VCOs 100 in accordance with the invention significantly reduce or eliminate these unwanted clock fluctuations. In other words, such VCOs 100 are more resistant to noise fluctuations in the supply voltage.

Figure 2:
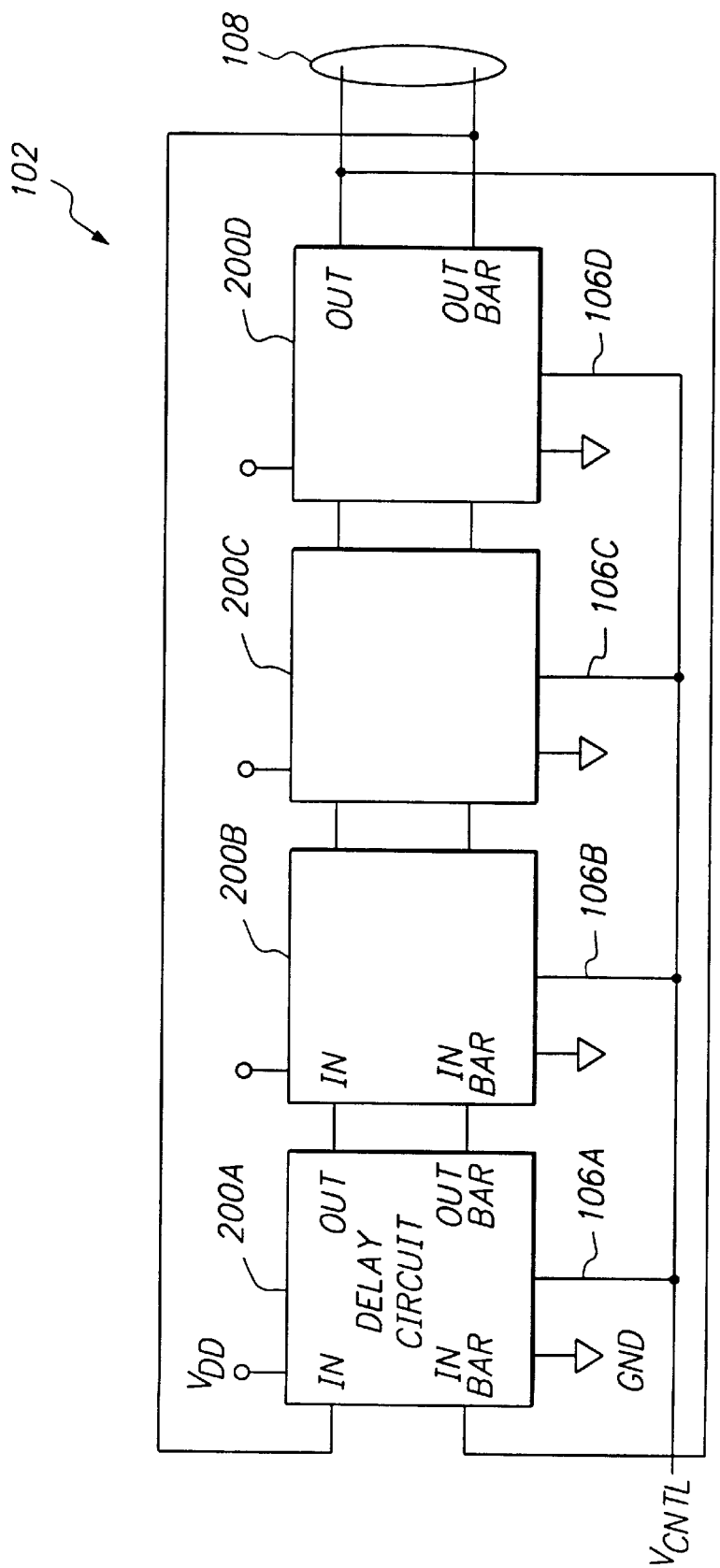
FIG. 2 is a block diagram of a preferred embodiment of the delay-based oscillator 102 of FIG. 1.

FIG. 2 is a block diagram of a preferred embodiment of the delay-based oscillator 102 of FIG. 1. The oscillator 102 includes one or more delay cells hereinafter "delay circuits") 200A–200D. Four are shown in the example of FIG. 2. Each delay circuit 200A–200D includes IN, INBAR, OUT, and OUTBAR ports. Each delay circuit 200A–200D is also adapted to receive the control voltage Vcntl on lines 106A–106D, respectively, and to be coupled to a supply voltage and a ground voltage.

The delay circuits 200A–200D are coupled in series. The OUT and OUTBAR ports of delay circuit 200A are coupled to the IN and INBAR ports of delay circuit 200B, with similar couplings between delay circuits 200B and 200C, and between circuits 200C and 200D. The OUT port of delay circuit 200D is coupled to the INBAR port of delay circuit 200A; while the OUTBAR port of delay circuit 200D is coupled to the IN port of delay circuit 200A. The OUT and OUTBAR ports of delay circuit 200D are also coupled to send a clock and its conjugate on lines 108 to the conditioning circuit 104.

Each delay circuit 200A–200D receives signals at its IN and INBAR ports, waits for a time period which we term the "propagation delay" of the circuit, and then generates the received signals at its OUT and OUTBAR ports, respectively. The length of the propagation delay is determined by the control voltage Vcntl on lines 106A–106D. In this preferred embodiment, the sum of the propagation delays for the delay circuits 200A–200D is the half-period delay of the delay-based oscillator 102. As their names suggest, the states received at the IN and INBAR ports, and generated at the OUT and OUTBAR ports are conjugates of each other.

The delay-based oscillator 102 operates as follows. Assume that the OUT port of delay circuit 200D, and hence the first clock on line 108, has just toggled to the 1 state. This 1 is fed back to the INBAR port of delay circuit 200A; while the corresponding 0 from the OUTBAR port of delay circuit 200D is fed back to the IN port of delay circuit 200A. The 1 and 0 will propagate through the chain of delay circuits 200A–200D, eventually making their way to the OUTBAR and OUT ports, respectively, of delay circuit 200D. At this point, the OUT port of circuit 200D, and also the clock on line 108, will toggle from 1 to 0. Similarly, the OUTBAR port of circuit 200D toggles from 0 to 1. The time required for propagation through the chain of delay circuits 200A–200D is the half-period delay of the delay-based oscillator 102. Repetition of this process produces the first clock on line 108.

Figure 3:
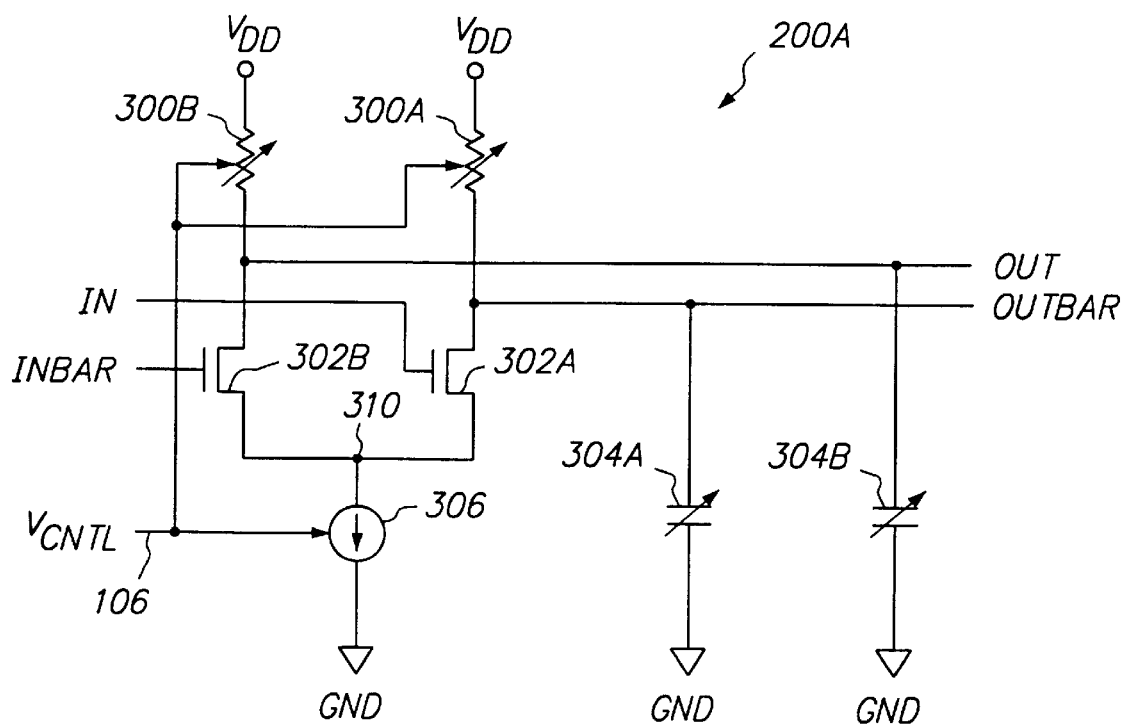
FIG. 3 is a circuit diagram of a preferred embodiment of the delay circuit 200A of FIG. 2.

FIG. 3 is a circuit diagram of a preferred embodiment of the delay circuit 200A of FIG. 2. In a preferred embodiment, the other delay circuits 200B–200D will have the same circuit design. The delay circuit 200A includes two voltage-controlled resistors 300A and 300B, two N-type transistors 302A and 302B, two variable capacitors 304A and 304B, and a voltage-controlled current source 306. Each of the transistors 302A and 302B includes a drain, a source, and a gate. In a preferred embodiment, the N-type transistors in FIG. 3 and the remaining FIGS. are NMOS transistors; while the P-type transistors are PMOS transistors.

The delay circuit 200A is coupled as follows. The resistor 300A is coupled between the supply voltage and the OUTBAR port of the delay circuit 200A and is adapted to receive the control voltage Vcntl on line 106A. The drain and source of the transistor 302A are coupled to the OUTBAR port and a node 310, respectively. The gate of the transistor 302A is coupled to the IN port of the delay circuit 200A. The variable capacitor 304A is coupled between the OUTBAR port and the ground voltage. The resistor 300B, transistor 302B, and variable capacitor 304B are coupled in an analogous fashion, but with respect to the INBAR and OUT port, rather than the IN and OUTBAR ports. The current source 306 is coupled between the node 310 and a ground voltage, and is also adapted to receive the control voltage Vcntl on line 106A. The resistance of the resistors 300A and 300B and the current produced by current source 306 are determined by the control voltage Vcntl.

The delay circuit 200A is a differential delay circuit characterized by the voltage swing $\Delta V$. The 1 state is represented by a voltage equal to the supply voltage Vdd;

while the 0 state is represented by a voltage Vdd−ΔV. The voltage swing ΔV ideally would be a constant unaffected by noise fluctuations in the supply voltage Vdd since fluctuations in the voltage swing ΔV are amplitude fluctuations in the signals transmitted by the OUT and OUTBAR ports which, in turn, cause amplitude fluctuations in the first clock on line 108.

The delay circuit 200A operates as follows. Assume for the moment that the control voltage Vcntl is fixed and consider the case in which IN begins in the 0 state and INBAR in the 1 state. Then, IN is a 0, transistor 302A is not conducting, variable capacitor 304A is pulled up to the supply voltage Vdd through resistor 300A, the voltage at OUTBAR port is Vdd, so OUTBAR is a 1. On the other hand, INBAR is a 1, transistor 302B is conducting, the current source 306 continuously pulls current through resistor 300B creating a voltage drop of ΔV over resistor 300B, the voltage at the OUT port is Vdd−ΔV, so OUT is a 0. If I is the current produced by current source 306 and R the resistance of resistor 300B, then $$\Delta V = I\, R. \qquad (\text{Eq. 1})$$

Furthermore, the product I R is ideally independent of the control voltage Vcntl (in addition to being independent of the supply voltage Vdd.

Now consider the situation when IN toggles to 1 and INBAR to 0. Transistor 302A turns on and the voltage at the OUTBAR port transitions from Vdd to Vdd−ΔV. The time required for this transition is the time required for the current source 306 to discharge the variable capacitor 304A from a voltage Vdd to a voltage Vdd−ΔV. This time is characterized by the time constant of the circuit including the resistor 300A and capacitor 304A. If the capacitor 304A has capacitance C, then the time constant τ=R C. Solving Eq. 1 for R and substituting then yields $$\tau = C\, \Delta V / I \qquad (\text{Eq. 2})$$

Transistor 302B, on the other hand, turns off, and the voltage at the OUT port transitions from Vdd−ΔV to Vdd. The time required for this transition is the time required to charge the variable capacitor 304B from a voltage Vdd−ΔV to a voltage Vdd. This time is also characterized by the time constant τ given in Eq. 2 above.

The propagation delay through the delay circuit 200A is also characterized by the time constant τ of Eq. 2 since the transitions of both the OUT and OUTBAR port are characterized by the time constant τ. The control voltage Vcntl determines the propagation delay of the delay circuit 200A by varying the current I produced by the current source 306. As shown by Eq. 2, increasing the current I reduces the propagation delay of the delay circuit 200A. The propagation delay of the circuit 200A, in turn, determines the frequency of the clock which is output by the delay-based oscillator 102.

In conventional delay circuits 200A, noise fluctuations in the supply voltage Vdd typically will cause unwanted fluctuations in the current I produced by the current source 306. If the resistance of resistors 300A and 300B are held constant, the fluctuations in current I will result in fluctuations in the voltage swing ΔV. If, on the other hand, the resistances are varied to compensate for the fluctuating current, then the voltage swing ΔV will be constant but τ and the corresponding propagation delay will fluctuate. Delay circuits 200A in accordance with the invention will compensate for these effects, as will be illustrated in more detail in the following FIGS.

FIG. 4 is a block diagram of a preferred embodiment of the voltage-controlled resistor 300A of FIG. 3. This embodiment is known in the art. The voltage-controlled resistor 300A includes a replica bias circuit 400 and a (voltage-controlled) resistor circuit 402. The replica bias circuit 400 is adapted to receive the supply voltage Vdd and to receive the control voltage Vcntl on line 106A. The resistor circuit 402 is coupled between the supply voltage Vdd and the OUT port, and is also coupled to receive a resistor control voltage (Rcntl) from the replica bias circuit 400. The resistance of the resistor 402 is determined by the difference between the supply voltage and the resistor control voltage (i.e. by Vdd−Rcntl). The resistor circuit 402 may be implemented simply using a PMOS transistor, or may be implement by a circuit as shown in FIG. 4A and discussed below.

The replica bias circuit 400 receives both the control voltage on line 106A and the supply voltage and generates the resistor control voltage in response. The control voltage sets the current I in Eq. 1 above, and the resistor control voltage Rcntl is selected in response to set the resistance of resistor circuit 402 to maintain ΔV near constant. This is because fluctuations in the supply voltage also cause fluctuations in the current I in Eq. 1, as will be discussed below. The difference between the supply voltage Vdd and the resistor control voltage Rcntl fluctuates with the supply voltage Vdd. Modifying the separation between the supply voltage and the resistor control voltage reduces the effect of these fluctuations by varying the resistance of resistor 402 in a compensating manner, resulting in a nearly constant ΔV. An implementation for the replica bias circuit 400 is shown in FIG. 4B and discussed below.

FIG. 4 is a circuit diagram of the single voltage-controlled resistor 300A. Taken literally, FIG. 4 might suggest that each such resistor 300A, 300B, etc., must include its own, separate replica bias circuit 400. Those of ordinary skill in the art will recognize this is not the case. For example, in a preferred embodiment, the entire delay-based oscillator has a single replica bias circuit 400. This single circuit 400 generates the resistor control voltage, which is distributed to many voltage-controlled resistors 402.

FIG. 4A is a circuit diagram of a preferred embodiment of the voltage-controlled resistor 402 of FIG. 4. This embodiment comprises a configuration of three PMOS transistors. A first PMOS transistor 404 has its source adapted to receive the supply voltage Vdd, its drain coupled to the OUTBAR port, and its gate adapted to receive the resistor control voltage Rcntl. A second PMOS transistor 406 has its source adapted to receive the supply voltage Vdd, its drain coupled to the source of s third PMOS transistor 408, and its gate adapted to receive the resistor control voltage Rcntl. The third PMOS transistor 408 has its source coupled to the drain of the second PMOS transistor 406, and both its drain and gate coupled to the OUTBAR port. A similar voltage-controlled resistor to the one shown in FIG. 4A is discussed in "A PLL Clock Generator with 5 to 110 MHz of Lock Range for Microprocessors," by Ian Young, Jeffrey Greason, and Keng Wong, IEEE Journal of Solid-State Circuits, vol. SC-27, pp. 1599–1607, Nov. 1992 (see FIG. 12 of this reference), which is herein incorporated by reference in its entirety.

Figure 4B:
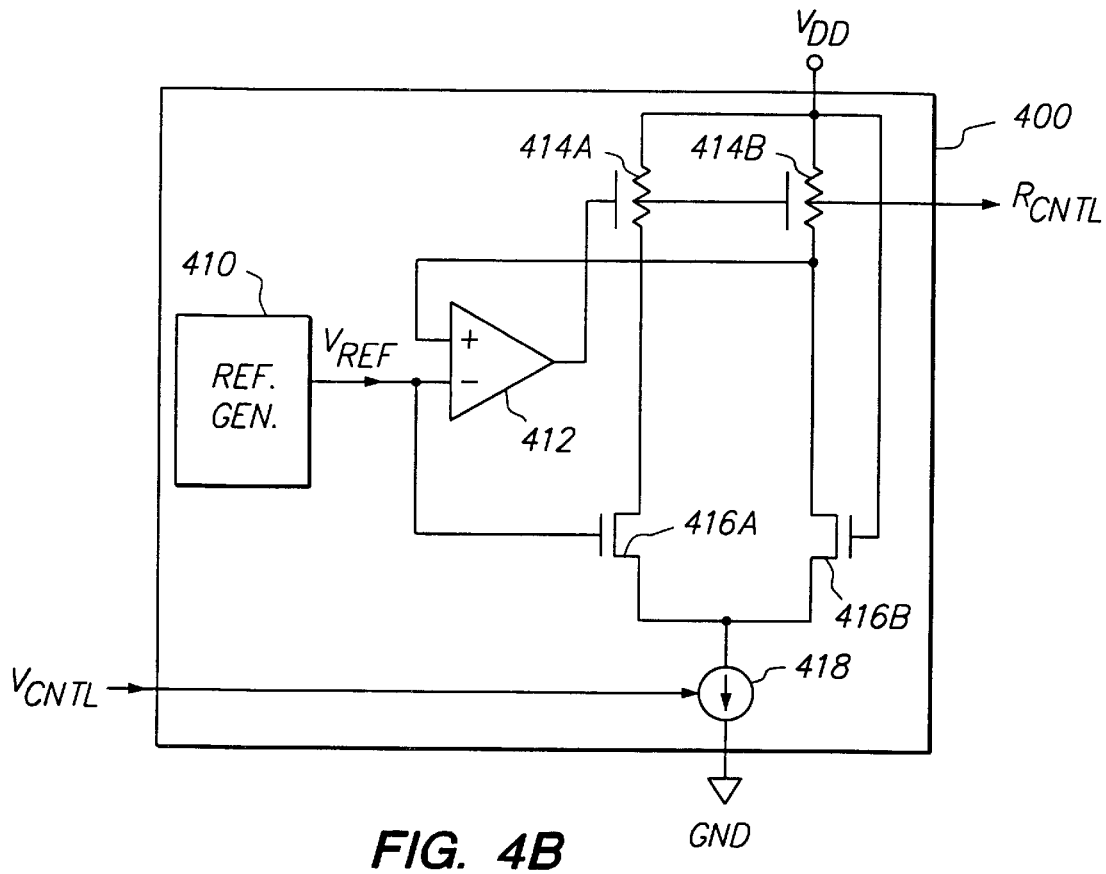
FIG. 4B is a circuit diagram of a preferred embodiment of the replica bias circuit 400 of FIG. 4.

FIG. 4B is a circuit diagram of a preferred embodiment of the replica bias circuit 400 of FIG. 4. The replica bias circuit 400 comprises a reference generator 410, an op amp 412, two (voltage-controlled) resistor circuits 414A–414B, two NMOS transistors 416A–416B, and a voltage-controlled current source 418. The reference generator 410 outputs a reference voltage Vref which is independent of the power supply Vdd. The op amp 412 has its negative input terminal adapted to receive the reference voltage Vref, its positive input terminal coupled to a "drain" terminal of the second resistor circuit 414B, and its output terminal coupled to the "gate" terminal of both resistor circuits 414A–414B and to the resistor control voltage Rcntl output terminal. The first resistor circuit 414A has its "source" terminal adapted to receive the supply voltage Vdd, its "drain" terminal coupled to the source of the first NMOS transistor 416A, and its "gate" terminal coupled to the output terminal of the op amp 412. The second resistor circuit 414B has its "source" terminal adapted to receive the supply voltage Vdd, its "drain" terminal coupled to both the source of the second NMOS transistor 416B and the positive input terminal of the op amp 412, and its "gate" terminal coupled to the output terminal of the op amp 412. The first NMOS transistor 416A has its source coupled to the "drain" terminal of the first resistor circuit 414A, its drain coupled to a first terminal of the current source 418, and its gate coupled to the negative input terminal of the op amp 412. The second NMOS transistor 416B has its source coupled to the "drain" terminal of the second resistor circuit 414B, its drain coupled to the first terminal of the current source 418, and its gate adapted to receive the supply voltage Vdd. The current source 418 has its first terminal connected to drain terminal of both NMOS transistors 416A–416B, its second terminal coupled to ground, and its third "control" terminal adapted to receive the control voltage Vcntl.

Together the two resistor circuits 414A–414B, the two NMOS transistors 416A–416B, and the current source 418 comprise a delay circuit of similar construction as the delay circuit 200A. Use of such a delay circuit, in combination with the reference generator 410 and the op amp 412, allows the replica bias circuit 400 to generate the appropriate bias for the resistor circuit 402. A similar replica bias circuit is shown and discussed in "A PLL Clock Generator with 5 to 110 MHz of Lock Range for Microprocessors," by Ian Young, Jeffrey Greason, and Keng Wong, IEEE Journal of Solid-State Circuits, vol. SC-27, pp. 1599–1607, Nov. 1992 (see FIG. 13 of this reference).

FIG. 5 is a circuit diagram of a preferred embodiment of the voltage-controlled current source 306 of FIG. 3. The current source 306 includes an N-type transistor 500. The drain and source of the transistor are coupled between the node 310 and a ground voltage. The gate of the transistor is adapted to receive the control voltage on line 106A.

Figure 6:
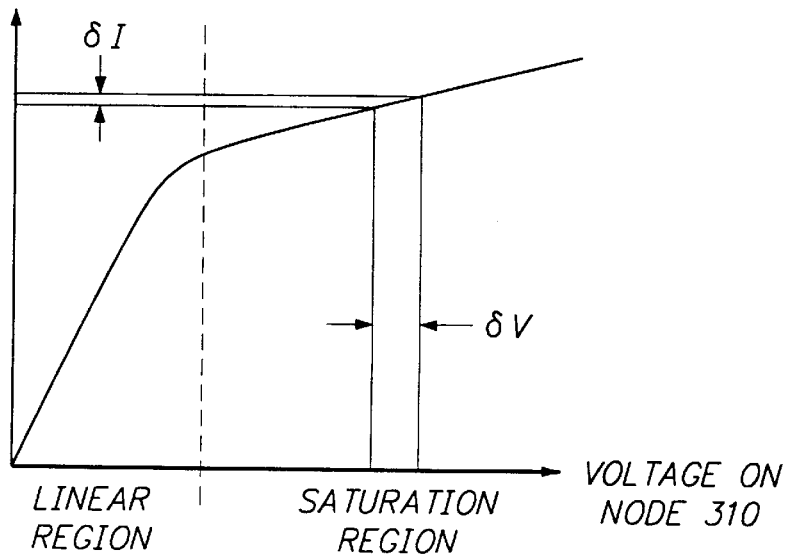
FIG. 6 is a graph illustrating operation of the transistor 500 of FIG. 5.

Operation of the current source 306 is illustrated by the graph of FIG. 6. The transistor 500 is operated in its saturation region. Hence, the current through the transistor 500 will be roughly independent of the drain-to-source voltage (Vds) across the transistor 500, as illustrated by the I-V curve in FIG. 6. The current, however, will be a strong function of the gate-to-source voltage (Vgs), which in this case is the control voltage on line 106A. Hence, the control voltage determines the current through the transistor 500.

The current, however, is not solely a function of the control voltage. Consider an increase in the supply voltage. If the supply voltage increases, then the voltage at node 310 will also increase since the voltage drop ΔV across the resistor 300A or 300B ideally is constant and the voltage drop across the conducting transistor 302A or 302B is nearly constant. As shown in FIG. 6, an increase in the voltage on node 310 by amount δV will result in an increase in the current I of amount δI. In other words, noise fluctuations in the supply voltage result in fluctuations in the current I. As discussed previously, the resistance R of Eq. 1 is varied to compensate for these current fluctuations in order to maintain the equality of Eq. 1.

Conventional delay circuits 200A, however, use constant capacitance capacitors 304A and 304B. The current fluctuations then cause fluctuations in the time constant τ of Eq. 2 and the corresponding propagation delay of the delay circuit 200A. Delay circuits 200A in accordance with the invention substantially avoid this effect by varying the capacitance of the variable capacitors 304A and 304B to compensate for the current fluctuations.

FIG. 7 is a circuit diagram of one embodiment of the variable capacitor 304A of FIG. 3. In a preferred embodiment, the variable capacitor 304B is similarly constructed. The variable capacitor 304A includes two capacitors 700 and 702 and a P-type transistor 704. One capacitor 700 is coupled between the OUTBAR port and a ground voltage. The other capacitor 702 is coupled between the supply voltage and the source of the transistor 704. The drain of transistor 704 is coupled to the OUTBAR port; while the gate of transistor 704 receives a compensation voltage (Vcomp) on line 706.

The variable capacitor 304A compensates for fluctuations in current source 306 as follows. The compensation voltage is chosen such that the difference between the supply voltage and the compensation voltage increases as the supply voltage increases. For example, the compensation voltage could be held at a constant voltage. The compensation voltage may be produced by a simple voltage divider circuit, or it may be received by coupling to either line 904 or line 905 of the circuit shown in FIG. 11 which is discussed below. When the supply voltage increases, the difference between the supply voltage and the compensation voltage increases, thus reducing the resistance of transistor 704.

The effective capacitance of variable capacitor 304A is $$C = C1 + k1\ C2$$

where C1 is the capacitance of capacitor 700, k1 is the conductance of transistor 704, and C2 is the capacitance of capacitor 702. (The conductance k1 is one when the resistance of the transistor 704 is zero, and k1 decreases to zero as the resistance of the transistor 704 approaches infinity.) As the supply voltage increases, k1 increases, and the effective capacitance of the variable capacitor 304B also increases. Since the time constant τ in Eq. 2 is proportional to C/I, the increased capacitance C compensates for the increased current I caused by the increased supply voltage.

Figure 8:
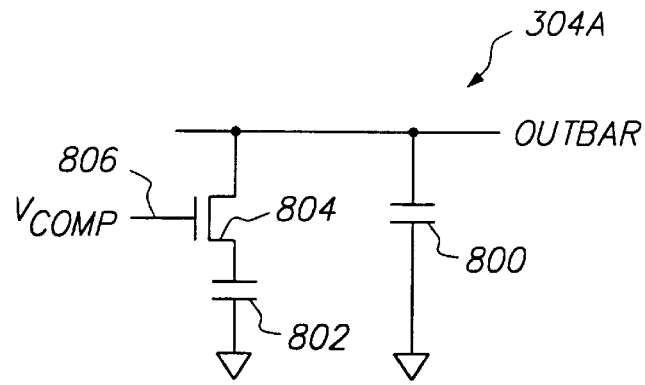
FIG. 8 is a circuit diagram of another embodiment of the variable capacitor 304B of FIG. 3.

FIG. 8 is a circuit diagram of another embodiment of the variable capacitor 304A of FIG. 3. This embodiment includes two capacitors 800 and 802 and an N-type transistor 804. The capacitor 800 is coupled between the OUTBAR port and the ground voltage. The capacitor 802 is coupled between the source of the transistor 804 and a ground voltage. The drain of the transistor 804 is coupled to the OUTBAR port; while the gate receives a compensation voltage on line 806. This embodiment operates in a similar fashion as the embodiment of FIG. 7 to compensate for changes in the current I by corresponding adjustments to the capacitance C. In particular, the compensation voltage is chosen such that the compensation voltage increases as the supply voltage increases. For example, the difference between the compensation voltage and the supply voltage could be held at a constant voltage. Alternately, the compensation voltage may be produced by a simple voltage divider circuit, or it may be received by coupling to line 1106 of the circuit shown in FIG. 11, discussed below. When the supply voltage increases, the compensation voltage increases, thus reducing the resistance of transistor 804.

Figure 9:
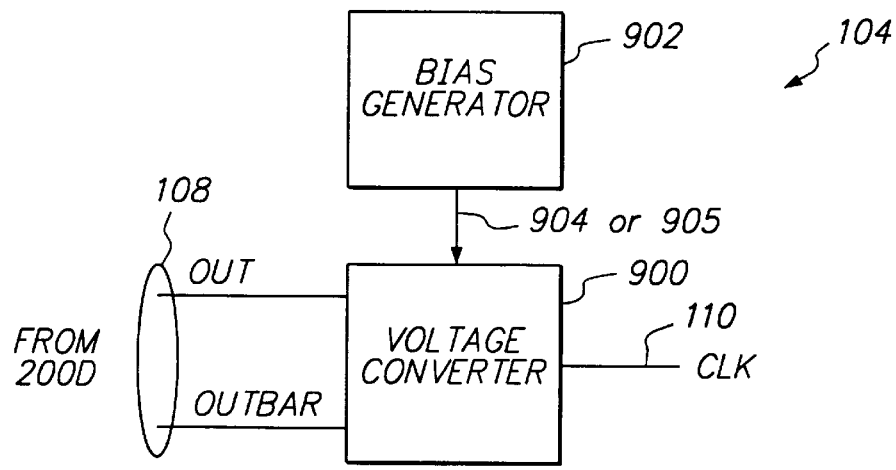
FIG. 9 is a block diagram of a preferred embodiment of the conditioning circuit 104 of FIG. 1.

FIG. 9 is a block diagram of a preferred embodiment of the conditioning circuit 104 of FIG. 1. The circuit 104 includes a voltage level converter 900 and a bias generator 902. The voltage level converter is coupled to receive the clock on line 108 and to transmit a second clock on line 110. The bias generator 902 is coupled to send a bias voltage to the voltage level converter 900 on either line 904 or line 905.

The voltage level converter 900 receives a clock utilizing small swing, differential voltage levels on line 108 and converts it to a clock utilizing CMOS voltage levels on line 110. The bias generator 902 produces a bias voltage to be used by the voltage level converter 900 in the conversion.

Figure 10:
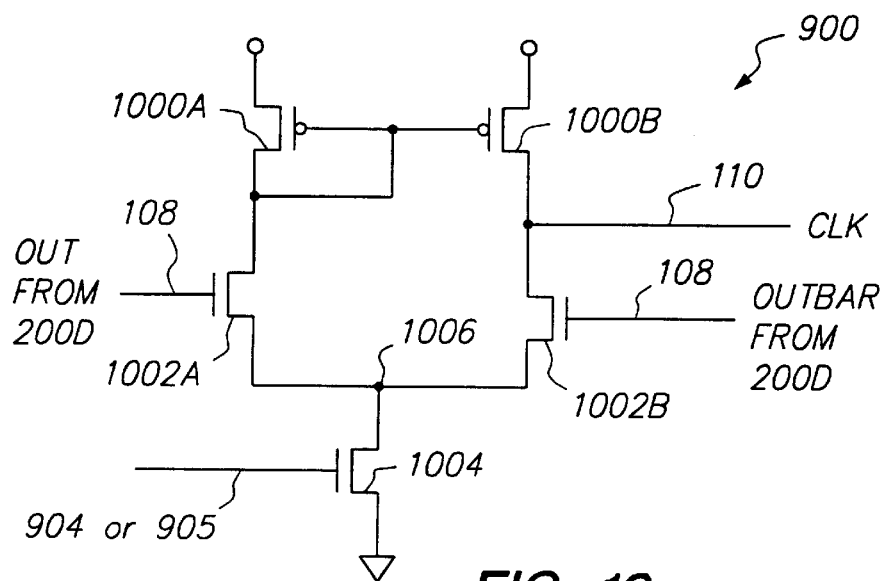
FIG. 10 is a circuit diagram of one embodiment of the voltage level converter 900 of FIG. 9.

FIG. 10 is a circuit diagram of one embodiment of the voltage level converter 900 FIG. 9. The voltage level converter 900 includes two P-type transistors 1000A and 1000B, two N-type transistors 1002A and 1002B, and a third N-type transistor 1004. The source of transistor 1000A is coupled to the supply voltage, the drains of transistors 1000A and 1002A are coupled together, and the source of transistor 1002A is coupled to a node 1006. The gate of transistor 1000A is coupled to its drain; while the gate of transistor 1002A is coupled to the OUT port of delay circuit 200D of FIG. 2 by line 108. Similarly, the source of transistor 1000B is coupled to receive the supply voltage, the drains of transistors 1000B and 1002B are coupled together, and the source of transistor 1002B is coupled to the node 1006. The gate of transistor 1000B is coupled to the gate of transistor 1000A; while the gate of transistor 1002B is coupled to the OUTBAR port of delay circuit 200D by line 108. The drains of transistors 1000B and 1002B are also coupled to transmit the second clock on line 110. The drain of transistor 1004 is coupled to the node 1006, the source coupled to the ground voltage, and the gate coupled to receive the bias voltage on either line 904 or line 905.

The transistor 1004 functions as a current source, with the current determined by the bias voltage on its gate. The propagation delay through voltage level converter 900 depends on the current through transistor 1004. Hence, a steady bias voltage on line 904 (or alternatively on line 905) will result in a constant current through transistor 1004 which, in turn, will result in a constant propagation delay through the voltage level converter 900. This will significantly reduce phase fluctuations in the second clock on line 110.

Figure 11:
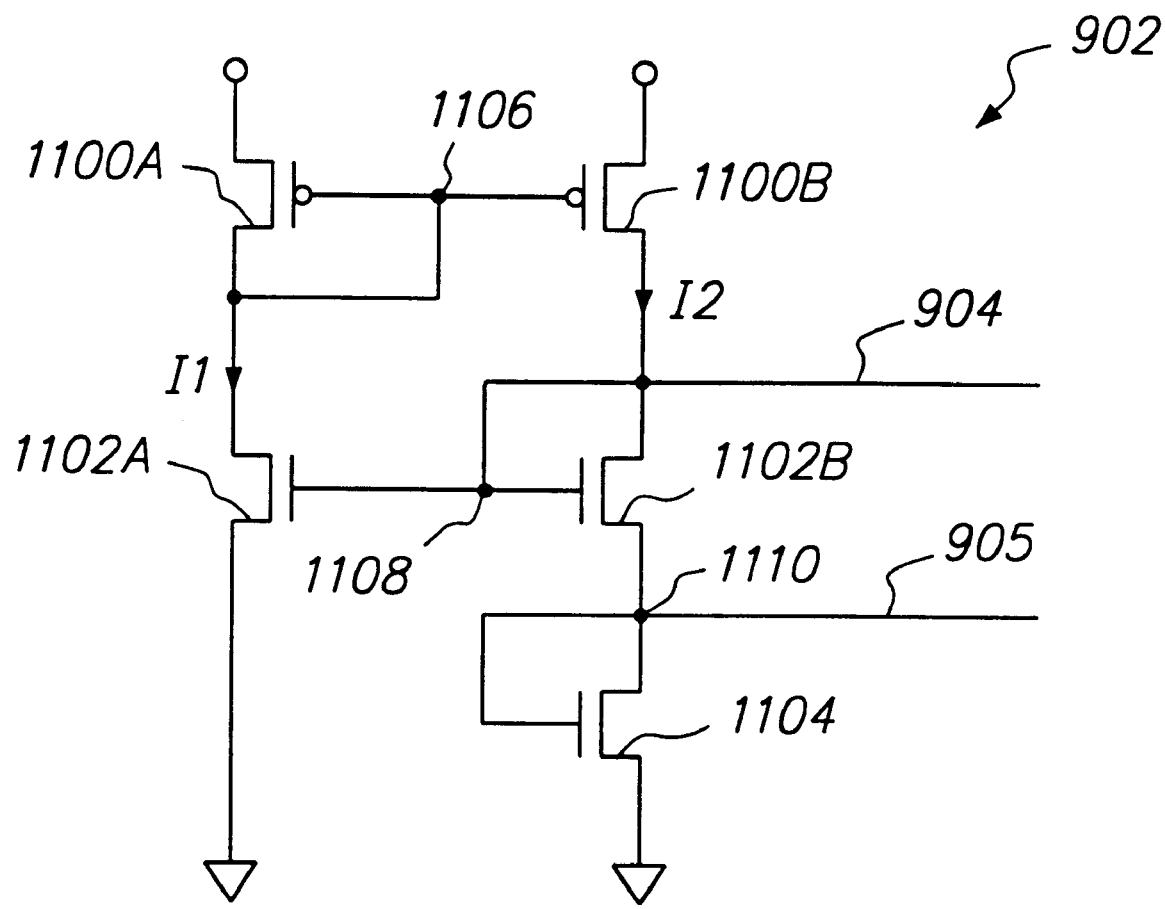
FIG. 11 is a circuit diagram of one embodiment of the bias generator 902 of FIG. 9.

FIG. 11 is a circuit diagram of one embodiment of the bias generator 902 of FIG. 9. The bias generator 902 includes two P-type transistors 1100A and 1100B, two N-type transistors 1102A and 1102B. The drain and gate of transistor 1102B are both coupled to the node 1108, and the source is coupled to a third node 1110. The drain and gate of transistor 1104 are coupled to node 1110, and the source is coupled to the ground voltage. The reference voltage for the voltage level converter 900 may be produced at either node 1108 or node 1110. Line 904 is coupled to node 1108 and line 905 is coupled to node 1110.

The bias generator 902 operates as follows. The currents I1 and I2 remain constant in the face of noise fluctuations of the supply voltage. The voltage on node 1106 increases and decreases with the supply voltage but the difference between the two voltages remains constant. The voltages on nodes 1108 and 1110 remain constant with respect to ground. This may be understood by considering the following.

First consider current I1 and transistors 1100A and 1102A. When the supply voltage increases, assume for the moment that the voltage on node 1106 remains constant. The gate to source voltage across transistor 1100A would then increase, resulting in an increased current I1. The increased current I1 flowing through transistor 1102A would result in a larger voltage drop across the transistor 1102A (since it is operating in its saturation region). The larger voltage drop, however, means that the voltage on node 1106 must have increased, in contradiction to the original assumption. Hence, the original assumption must be incorrect and the voltage on node 1106 must therefore increase as the supply voltage increases, maintaining a constant voltage gap between itself and the supply voltage. This then results in a constant current I1.

Now consider the current I2 and transistors 1100B, 1102B and 1104. When the supply voltage increases, assume that the voltage on node 1108 also increases. If this occurs, the current I2 will increase (since transistor 1100B is operating in its saturation region). Because the resistance of transistor 1100B is large, the voltage drop across transistor 1100B will increase greatly due to the increased I2. The greatly increased voltage drop across transistor 1100B means that the voltage on node 1108 must have decreased, in contradiction to our original assumption. Hence, the original assumption must be incorrect. Hence, the original assumption must be incorrect and the voltage on node 1108 must remain fixed and the current I2 must also remain constant.

Although the invention has been described in considerable detail with reference to certain preferred embodiments thereof, other embodiments are possible. For example, the invention can be incorporated into an integrated circuit on a semiconductor device using techniques known in the art. Therefore, the spirit and scope of the appended claims should not be limited to the description of the preferred embodiments contained herein.

What is claimed is:

1. A differential delay circuit for use in a voltage-controlled oscillator comprising:

a differential transmission circuit having a differential input and a differential output for transmitting a logic signal received at the differential input to the differential output, and adapted to receive a supply voltage; and a variable capacitance coupled to the differential output for delaying transmission of the received logic signal from the differential input to the differential output by a propagation delay, wherein the propagation delay is determined by a time required to discharge the variable capacitance, the variable capacitance is varied in response to noise fluctuations in the supply voltage, and the varying capacitance compensates for variations in the propagation delay caused by effects of the noise fluctuations on the differential transmission circuit.

2. The differential delay circuit of claim 1 wherein:

the differential input of the differential transmission circuit comprises an IN port and an INBAR port;

the differential output of the differential transmission circuit comprises an OUT port and an OUTBAR port; and the differential transmission circuit further comprises:

a first resistor adapted to be coupled between the supply voltage and the OUT port;

a first transistor having a gate, a source, and a drain, the drain coupled to the OUT port, the source coupled to a first node, and the gate coupled to the INBAR port;

a second resistor adapted to be coupled between the supply voltage and the OUTBAR port;

a second transistor having a gate, a source, and a drain, the drain coupled to the OUTBAR port, the source coupled to the first node, and the gate coupled to the IN port; and a current source coupled to the first node and adapted to receive a control voltage, for drawing a current from the first node, wherein the current is determined by the control voltage, and the propagation delay is determined by a time required for the current source to discharge the variable capacitance.

3. The differential delay circuit of claim 2 further comprising:

a replica bias circuit adapted to receive the supply voltage, for producing a resistor control voltage, the resistor control voltage differing from the supply voltage by a constant voltage; and wherein at least one of the first and second resistors comprises a voltage-controlled resistor coupled to receive the resistor control voltage.

4. The differential delay circuit of claim 2 wherein the current source comprises:

a third transistor having a gate, a source, and a drain, the drain coupled to the first node, and the gate adapted to receive the control voltage.

5. The differential delay circuit of claim 1 wherein the variable capacitance comprises:

a first capacitor adapted to be coupled between the differential output of the differential transmission circuit and a ground voltage;

a transistor having a gate, a source, and a drain, the drain coupled to the differential output, and the gate adapted to receive a compensation voltage which controls the conductance of the transistor; and a second capacitor adapted to be coupled between the supply voltage and the source of the transistor.

6. The differential delay circuit of claim 1 wherein the variable capacitance comprises:

a first capacitor adapted to be coupled between the differential output of the differential transmission circuit and a ground voltage;

a transistor having a gate, a source, and a drain, the drain coupled to the differential output, and the gate adapted to receive a compensation voltage; and a second capacitor adapted to be coupled between the source of the transistor and the ground voltage.

7. The differential delay circuit of claim 3 wherein the voltage-controlled resistor comprises:

a third transistor having a gate, a source, and a drain, the source adapted to receive the supply voltage, and the gate coupled to receive the resistor control voltage;

a fourth transistor having a gate, a source, and a drain, the source adapted to receive the supply voltage, and the gate coupled to receive the resistor control voltage; and a fifth transistor having a gate, a source, and a drain, the source coupled to the drain of the fourth transistor, and the gate and the drain coupled to the drain of the third transistor.

8. The differential delay circuit of claim 3 wherein:

a first and second logic states of the logic signal are represented by first and second voltages which differ by a differential voltage, the differential voltage equal to a voltage drop across the voltage-controlled resistor due to the current drawn by the current source; and the replica bias generator varies a resistance of the voltage-controlled resistor in response to noise fluctuations in the supply voltage, and the varying resistance compensates for variations in the differential voltage caused by effects of the noise fluctuations on the current drawn by the current source.

9. The differential delay circuit of claim 8 wherein:

the propagation delay is determined by a product of the resistance of the voltage-controlled resistor and the capacitance of the variable capacitance; and the varying capacitance compensates for fluctuations in the product caused by the varying resistance.

10. The differential delay circuit of claim 1 further comprising:

a compensation voltage generator adapted to receive the supply voltage, for generating a compensation voltage for varying the variable capacitance.

11. The differential delay circuit of claim 10 wherein:

the compensation voltage generator generates a compensation voltage in which the difference between the supply voltage and the compensation voltage increases as the supply voltage increases.

12. The differential delay circuit of claim 11 wherein the compensation voltage generator comprises:

a voltage divider adapted to be coupled between the supply voltage and a ground voltage, for producing the compensation voltage.

13. The differential delay circuit of claim 11 wherein:

the compensation voltage generator generates a constant compensation voltage.

14. The differential delay circuit of claim 11 wherein the compensation voltage generator comprises:

a first P-type transistor having a gate, a source, and a drain, the source adapted to receive the supply voltage, and the gate and the drain coupled to a first node;

a first N-type transistor having a gate, a source, and a drain, the drain coupled to the first node, the gate coupled to a second node, and the source adapted to be coupled to a ground voltage;

a second P-type transistor having a gate, a source, and a drain, the source adapted to receive the supply voltage, the gate coupled to the first node, and the drain coupled to the second node;

a second N-type transistor having a gate, a source, and a drain, the drain and gate coupled to the second node, and the source coupled to a third node;

a third N-type transistor having a gate, a source, and a drain, the drain and gate coupled to the third node, and the source adapted to be coupled to the ground voltage; and the second node is coupled to provide the compensation voltage to the variable capacitance.

15. The differential delay circuit of claim 11 wherein the compensation voltage generator comprises:

a first P-type transistor having a gate, a source, and a drain, the source adapted to receive the supply voltage, and the gate and the drain coupled to a first node;

a first N-type transistor having a gate, a source, and a drain, the drain coupled to the first node, the gate coupled to a second node, and the source adapted to be coupled to a ground voltage;

a second P-type transistor having a gate, a source, and a drain, the source adapted to receive the supply voltage, the gate coupled to the first node, and the drain coupled to the second node;

a second N-type transistor having a gate, a source, and a drain, the drain and gate coupled to the second node, and the source coupled to a third node;

a third N-type transistor having a gate, a source, and a drain, the drain and gate coupled to the third node, and the source adapted to be coupled to the ground voltage; and the third node is coupled to provide the compensation voltage to the variable capacitance.

16. A noise-resistant voltage-controlled oscillator comprising:

at least two differential delay circuits coupled in series for generating a first clock, each differential delay circuit comprising:

a differential transmission circuit having a differential input and a differential output for transmitting a logic signal received at the differential input to the differential output, and adapted to receive a supply voltage, the differential output coupled to the differential input of a next differential delay circuit in the series or, for a last differential delay circuit in the series, coupled to the differential input of a first differential delay circuit in the series, and a variable capacitance coupled to the differential output for delaying transmission of the received logic signal from the differential input to the differential output by a propagation delay, wherein the propagation delay is determined by a time required to discharge the variable capacitance, the variable capacitance is varied in response to noise fluctuations in the supply voltage, and the varying capacitance compensates for variations in the propagation delay caused by effects of the noise fluctuations on the differential transmission circuit; and a conditioning circuit coupled to receive the first clock and adapted to transmit a second clock, for converting the first clock to the second clock.

17. The voltage-controlled oscillator of claim 16 wherein the conditioning circuit comprises a voltage level converter coupled to receive the first clock and adapted to transmit the second clock, the first clock utilizing first voltage levels, the second clock utilizing second voltage levels; and a bias generator adapted to receive the supply voltage and coupled to transmit a bias voltage to the voltage level converter, the bias voltage substantially unaffected by noise fluctuations in the supply voltage.

18. The voltage-controlled oscillator of claim 17 wherein the bias generator comprises:

a first P-type transistor having a gate, a source, and a drain, the source adapted to receive the supply voltage, and the gate and the drain coupled to a first node;

a first N-type transistor having a gate, a source, and a drain, the drain coupled to the first node, the gate coupled to a second node, and the source adapted to be coupled to a ground voltage;

a second P-type transistor having a gate, a source, and a drain, the source adapted to receive the supply voltage, the gate coupled to the first node, and the drain coupled to the second node;

a second N-type transistor having a gate, a source, and a drain, the drain and gate coupled to the second node, and the source coupled to a third node; and a third N-type transistor having a gate, a source, and a drain, the drain and gate coupled to the third node, and the source adapted to be coupled to the ground voltage.

19. The voltage-controlled oscillator of claim 17 wherein the bias generator comprises:

a first P-type transistor having a gate, a source, and a drain, the source adapted to receive the supply voltage, and the gate and the drain coupled to a first node;

a second P-type transistor having a gate, a source, and a drain, the source coupled to the first node, and the drain and gate coupled to a second node;

a first N-type transistor having a gate, a source, and a drain, the drain coupled to the second node, the gate coupled to a third node, and the source adapted to be coupled to a ground voltage;

a third P-type transistor having a gate, a source, and a drain, the source adapted to receive the supply voltage, the gate coupled to the second node, and the drain coupled to the third node;

a second N-type transistor having a gate, a source, and a drain, the drain and gate coupled to the third node, and the source adapted to be coupled to the ground voltage.

20. A method for generating a clock comprising the steps of:

waiting for at least one propagation delay in succession, a length of each propagation delay determined by a time required to discharge a variable capacitance;

varying the variable capacitance in response to noise fluctuations in the supply voltage, the varying capacitance compensating for variations in the propagation delay caused by noise fluctuations in the supply voltage; and toggling a state of a clock after waiting for the propagation delays.

21. The method of claim 20 further comprising the step of:
conditioning the clock.

22. The method of claim 21 wherein conditioning the clock comprises the step of:

converting the clock from a first voltage level to a second voltage level.

23. The method of claim 20 further comprising the steps of:

drawing a current through a variable resistance to produce a differential voltage, wherein a first and second states of the clock are represented by first and second voltages separated by the differential voltage; and varying the variable resistance in response to noise fluctuations in the supply voltage, wherein the varying resistance compensates for variations in the differential voltage caused by effects of the noise fluctuations on the current drawn through the variable resistance.

24. The method of claim 23 wherein:

the propagation delay is determined by a product of the variable resistance and the variable capacitance; and varying the variable capacitance compensates for fluctuations in the product caused by the varying resistance.

* * * * *